(12) United States Patent
Peng et al.

(10) Patent No.: US 8,934,251 B2
(45) Date of Patent: Jan. 13, 2015

(54) CABINET FOR ELECTRONIC DEVICES AND ELECTRONIC ASSEMBLY USING THE SAME

(75) Inventors: Wen-Tang Peng, New Taipei (TW); Wei Qiu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 472 days.

(21) Appl. No.: 13/272,237

(22) Filed: Oct. 13, 2011

(65) Prior Publication Data

US 2012/0250261 A1 Oct. 4, 2012

(30) Foreign Application Priority Data

Mar. 31, 2011 (CN) .......................... 2011 1 0080351

(51) Int. Cl.
*H05K 5/00* (2006.01)
*H05K 7/00* (2006.01)
*A45D 19/04* (2006.01)
*H05K 7/14* (2006.01)

(52) U.S. Cl.
CPC .................................... *H05K 7/1489* (2013.01)
USPC ........... 361/724; 361/726; 361/727; 361/732; 361/747; 361/679.02; 361/679.37; 361/679.39; 248/155.3; 248/155.5; 292/169.14

(58) Field of Classification Search
CPC ..... G06F 1/16; G06F 1/33225; H05K 5/0026; H05K 5/026; H05K 2201/10159
USPC ............... 361/679.31–679.4, 679.41–679.49, 361/679.55–679.6, 724–733; 439/157, 60, 439/152–153, 327, 328, 331; 369/75.11, 369/75.21, 76, 77.11, 77.21, 78, 79, 80, 81, 369/82; 248/80–88, 155.1–155.5, 166–173, 248/180.1–186.2, 229.1–231.51, 271.4, 248/292.14, 316.1–316.8; 74/141–169, 74/380–387; 292/1–62, 113, 292/169.11–169.23, 341.11–341.19
See application file for complete search history.

(56) References Cited

U.S. PATENT DOCUMENTS

| 6,609,619 B2 * | 8/2003 | Abbott ............................ 211/26 |
| 2003/0209958 A1 * | 11/2003 | Hwang et al. ............. 312/334.46 |
| 2003/0227753 A1 * | 12/2003 | Wrycraft ........................ 361/727 |
| 2003/0234602 A1 * | 12/2003 | Cutler et al. .................. 312/333 |

FOREIGN PATENT DOCUMENTS

TW M303803 1/2007

* cited by examiner

*Primary Examiner* — Jerry Wu
(74) *Attorney, Agent, or Firm* — Novak Druce Connolly Bove + Quigg LLP

(57) ABSTRACT

A cabinet for electronic devices includes a rack and engaging units. The rack includes a first supporting post, a second supporting post, a third supporting post and a fourth supporting post located at four corners of an imaginary rectangular parallelepiped. An opening is defined between the first supporting post and the second supporting post for the electronic devices inserted therein. Each of the third and fourth supporting posts defines a plurality of pairs of slots therein. The engaging units are mounted on the third and the fourth supporting posts, respectively. Each of the engaging units includes a pair of pins received in a corresponding pair of slots and a pressing element connected with the pins. The pressing element is horizontally moveable by the pins sliding along the corresponding pair of slots to thereby adjust an abutting force between the pressing element and a corresponding electronic device.

19 Claims, 2 Drawing Sheets

CABINET FOR ELECTRONIC DEVICES AND ELECTRONIC ASSEMBLY USING THE SAME

BACKGROUND

1. Technical Field

The disclosure relates to cabinets for electronic devices, and more particularly to a cabinet having engaging units for the electronic devices received therein such that the electronic devices do not shake or tremble during transportation of the cabinet.

2. Description of the Related Art

Electronic devices, such as servers, are frequently housed in modular form in a standardized enclosure. In particular, servers are generally rack-mounted in a cabinet.

Each server is a stand-alone computer that includes many electronic components, such as one or more processors, random-access memory (RAM), fixed disks, alternating current (AC) to direct current (DC) power supplies, and the like. For unified management, the servers are arranged in the cabinet one-by-one from bottom to top. However, to insert a server into the cabinet smoothly, clearances are usually defined between outer surfaces of the server and inner surfaces of the cabinet. Thus, the servers received in the cabinet may shake or tremble when the cabinet undergoes transportation from one place to another. Such shaking or trembling may cause damage to the electronic components of the servers.

What is desired, therefore, is a cabinet which can overcome the above-described shortcomings.

DETAILED DESCRIPTION

Figure 1:
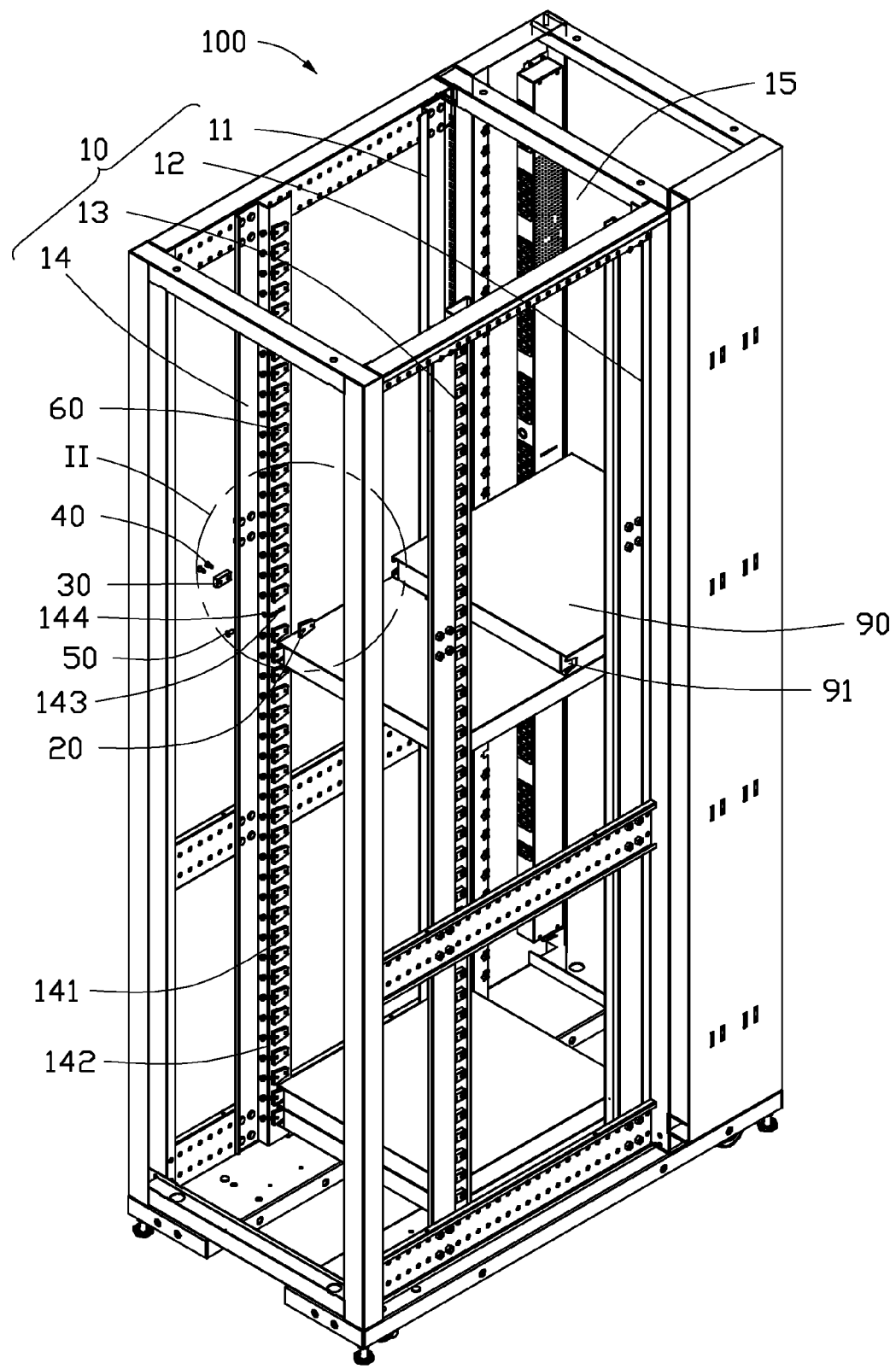
FIG. 1 is a schematic, isometric, assembled view of a cabinet in accordance with an exemplary embodiment, together with three electronic devices mounted in the cabinet and another electronic device being inserted into the cabinet.
Figure 2:
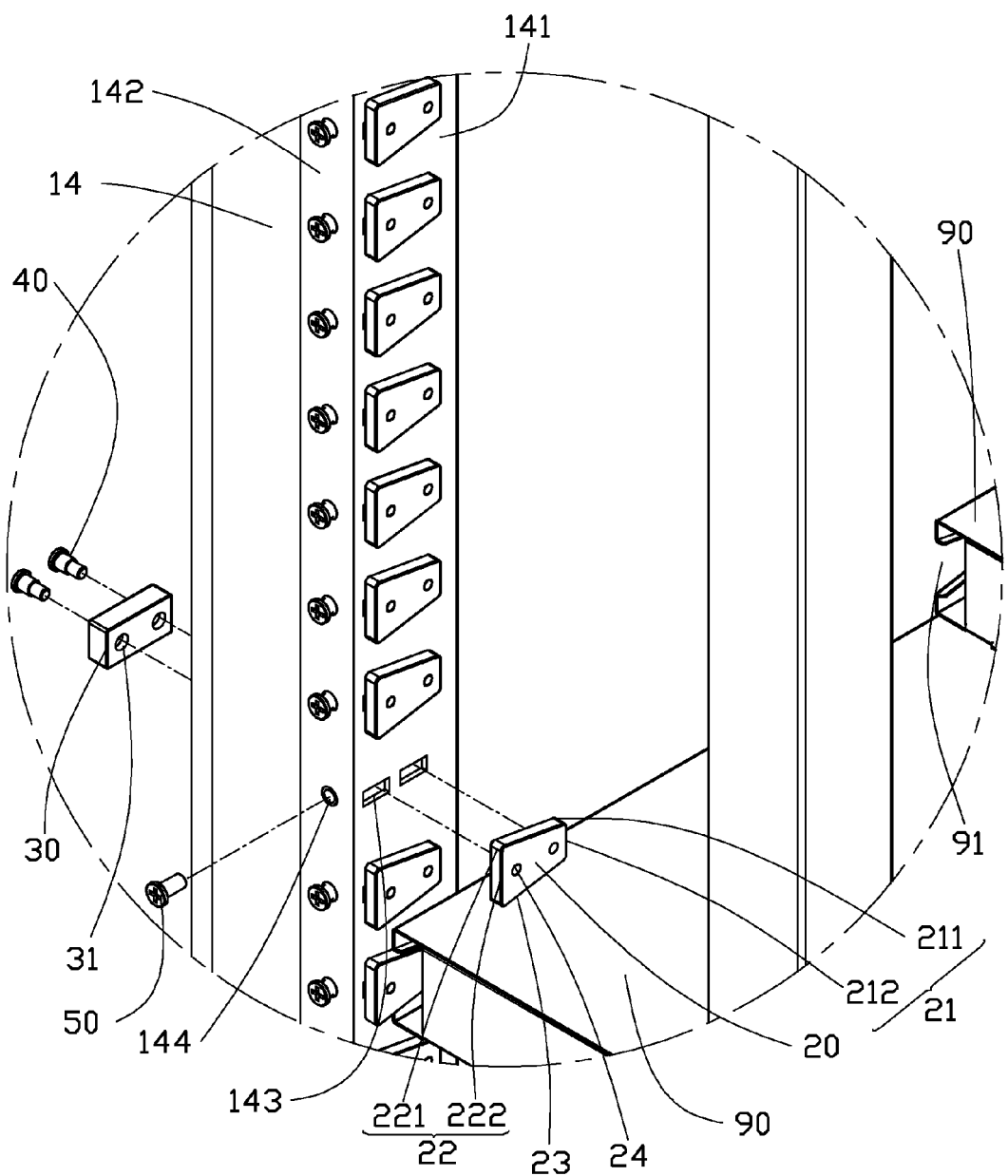
FIG. 2 is an enlarged view of a circled portion II of FIG. 1.

Reference will now be made to the drawing figures to describe the present cabinet in detail.

Referring to FIG. 1, a cabinet 100 in accordance with an exemplary embodiment is for accommodating a plurality of electronic devices 90 therein. The cabinet 100 includes a rack 10 and a plurality of engaging units 60. Each of the engaging units 60 includes a pressing element 20, a sliding element 30, a pair of pins 40, and an adjusting fastener 50.

The rack 10 has a rectangular parallelepiped construction. Two lateral side faces of the rectangular parallelepiped define two lateral sides of the rack 10, and the two lateral sides of the rack 10 are parallel to each other. A rear face of the rectangular parallelepiped defines a rear side of the rack 10. The rack 10 includes a first supporting post 11, a second supporting post 12, a third supporting post 13 and a fourth supporting post 14 located at four corners of the rectangular parallelepiped, respectively. The first, second, third and fourth supporting posts 11, 12, 13, 14 cooperatively form a hollow rectangular frame for the electronic devices 90 to be mounted therein. The first and second supporting posts 11, 12 are located at a front side of the cabinet 100. The first and second supporting posts 11, 12 are parallel to and spaced from each other, with an opening 15 defined therebetween. The third and fourth supporting posts 13, 14 are located at a rear side of the cabinet 100, and are aligned with the second and first supporting posts 12, 11, respectively. The third and fourth supporting posts 13, 14 have similar configurations to each other, and face each other. For brevity, a configuration of the fourth supporting post 14 will be explained in detail hereinafter, while a description of the third supporting post 13 is omitted.

The fourth supporting post 14 includes an elongated first side wall 141, and an elongated second side wall 142 perpendicular to the first side wall 141. The first side wall 141 is parallel to the corresponding lateral side of the rack 10, and is aligned with flanges (not labeled) of the first supporting post 11. The second side wall 142 is parallel to the rear side of the rack 10, and is aligned with a second side wall (not labeled) of the third supporting post 13. Thus, the second side wall 142 is perpendicular to the first side wall 141.

A plurality of pairs of slots 143 is defined in the first side wall 141. The slots 143 in each pair of slots 143 are level with each other. In this embodiment, the slots 143 in each pair of slots 143 have the same length. The pairs of slots 143 are arranged in the first side wall 141 one above the other along an axial (vertical) direction of the first side wall 141, with a substantially equal distance defined between each two neighboring pairs of slots 143. The distance between each two neighboring pairs of slots 143 is slightly larger than a thickness of each of the electronic devices 90, for allowing a corresponding electronic device 90 to be inserted at that location. A plurality of through holes 144 is defined in the second side wall 142. The through holes 144 are arranged one above the other in the second side wall 142 along an axial (vertical) direction of the second side wall 142, with a substantially equal distance defined between each two neighboring through holes 144. The through holes 144 correspond to the pairs of slots 143, respectively. That is, each of the through holes 144 of the second side wall 142 is level with a corresponding pair of slots 143 of the first side wall 141.

The pressing element 20 is a tapered plate, and includes a first end surface 21, a second end surface 22 parallel to and spaced from the first end surface 21, and two inclined side surfaces 23 connected between two corresponding ends of the first and second end surfaces 21, 22, respectively. Each of the first and second end surfaces 21, 22 is substantially rectangular. A length of the first end surface 21 is less than that of the second end surface 22. The first end surface 21 includes two first horizontal sides 211 respectively perpendicular to the first side wall 141, and two first vertical sides 212 respectively parallel to the first side wall 141. The second end surface 22 includes two second horizontal sides 221 parallel to the first horizontal sides 211 of the first end surface 21, and two second vertical sides 222 parallel to the first vertical sides 212 of the first end surface 21. The first horizontal sides 211 and the second horizontal sides 221 all have a same length. The second vertical sides 222 are longer than the first vertical sides 212. Thereby, the two inclined side surfaces 23 form a convergent end of the pressing element 20 at the first end surface 21, and a divergent end of the pressing element 20 at the second end surface 22. A distance defined between the two inclined side surfaces 23 gradually increases from the convergent end to the divergent end.

The pressing element 20 defines two circular through holes 24 therein. Each of the circular through holes 24 extends along a direction parallel to the first horizontal sides 211 and the second horizontal sides 221. A distance between the two circular through holes 24 is substantially equal to a distance between an inner (rear) end of a front one of the corresponding pair of slots 143 and an outer (rear) end of a rear one of the corresponding pair of slots 143. That is, the inner (rear) end of the front slot 143 is adjacent the rear slot 143, and the outer (rear) end of the rear slot 143 is far away from the front slot 143. A diameter of each circular through hole 24 is substantially equal to a transverse width of the slots 143, and much smaller than a length of the slots 143.

The sliding element 30 is a substantially rectangular shaped block. The sliding element 30 defines two perforations 31 corresponding to the circular through holes 24 of the pressing element 20.

The engaging units 60 are mounted on the third and fourth supporting posts 13, 14 along the axial directions thereof. For brevity, only one engaging unit 60 mounted on the fourth supporting post 14 is described below. The sliding element 30 and the pressing element 20 are located at two opposite sides of the first side wall 141 of the fourth supporting post 14, respectively, with the perforations 31 of the sliding element 30 aligned with a corresponding pair of slots 143, and the circular through holes 24 of the pressing element 20 aligned with the corresponding pair of slots 143. Detailedly, the sliding element 30 is located at an outer side of the first side wall 141 which is farther away from the third supporting post 13, and the pressing element 20 is located at an inner side of the first side wall 141 which is nearer the third supporting post 13. The first end surface 21 of the pressing element 20 is nearer to the opening 15 of the rack 10, while the second end surface 22 of the pressing element 20 is farther away from the opening 15 of the rack 10.

The pair of pins 40 are respectively extended through the perforations 31, the slots 143 and the circular through holes 24 in sequence to thereby connect the pressing element 20, the sliding element 30 and the fourth supporting post 14 together. The adjusting fastener 50 traverses through the through hole 144, with a distal end of the adjusting fastener 50 abutting against the sliding element 30. The adjusting fastener 50 is horizontally moveable in the through hole 144 along a direction parallel to the corresponding pair of slots 143.

The electronic devices 90 can be servers or data storages, which have a rectangular outer shape corresponding to a horizontal cross section of the rectangular parallelepiped of the rack 10. Thus, the electronic devices 90 can be received in the rack 10 by stacking them along a bottom to top direction of the rack 10. When one of the electronic devices 90 is inserted into the rack 10 via the opening 15, two opposite sides of a front end of the electronic device 90 are connected with the first second supporting posts 11, 12, respectively, and two opposite sides of a rear end of the electronic device 90 are connected with the third and fourth supporting posts 13, 14, respectively. Each of the electronic devices 90 defines two cutouts 91 at rear ends of two opposite lateral sides thereof, respectively. Each of the cutouts 91 has a shape matched with an outer shape of each pressing element 20.

When each electronic device 90 is assembled into the rack 10, the electronic device 90 is inserted into the rack 10 via the opening 15, with the cutouts 91 aimed with two corresponding pressing elements 20 mounted at the third and fourth supporting posts 13, 14, respectively. The electronic device 90 is inserted until the first end surfaces 21 of the pressing elements 20 are received in the cutouts 91 of the electronic device 90, respectively. Then the adjusting fasteners 50 are pushed inwardly to move towards the sliding elements 30. Thus, the sliding elements 30 and the pressing elements 20 are moved together toward the electronic device 90 via the pins 40 sliding along the slots 143, until the pressing elements 20 are engagingly received in the cutouts 91 of the electronic device 90.

Due to the inclined side surfaces 23 provided on the pressing elements 20, the pressing elements 20 can easily enter the corresponding cutouts 91 of the electronic device 90. In addition, an engaging force between the pressing elements 20 and the electronic device 90 can be adjusted by changing the lengths of portions of the pressing elements 20 which are extended into the cutouts 91. Thus, the electronic device 90 can be firmly secured in place, so that it does not shake or tremble during transportation of the rack 10.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A cabinet for accommodating electronic devices, the electronic devices each having a cutout, the cabinet comprising:
    a rack having a rectangular parallelepiped construction, the rack comprising a first supporting post, a second supporting post, a third supporting post and a fourth supporting post located at four corners of the rectangular parallelepiped, an opening defined between the first supporting post and the second supporting post for the electronic devices to be inserted into the rack, each of the third and fourth supporting posts defining a plurality of pairs of slots therein, the pairs of slots arranged one above the other; and
    a plurality of engaging units corresponding to the electronic devices being mounted on the third and the fourth supporting posts, respectively, each of the engaging units comprising a sliding element defining a pair of perforations corresponding to a corresponding pair of slots, a pair of pins received through the pair of perforations in the corresponding pair of slots and a pressing element connected with the pins, wherein each of the pair of pins are slidable in the corresponding pair of slots, the pressing element is horizontally moveable toward the opening to thereby adjust physical engagement between portions of the pressing element extended into the cutout of the electronic device, and thereby securing the electronic device to the rack when the electronic device is received in the rack.

2. The cabinet of claim 1, wherein the pressing element comprises a first end surface nearer to the opening and a second end surface far away from the opening, the second end surface being longer than the first end surface.

3. The cabinet of claim 2, wherein the pressing element further comprises two inclined side surfaces connected between two opposite ends of the first and second end surfaces, respectively, the inclined side surfaces forming a convergent end of the pressing element at the first end surface and a divergent end of the pressing element at the second end surface.

4. The cabinet of claim 2, wherein the slots in each pair of slots are aligned with each other, the pressing element defines two circular through holes corresponding to the respective pair of slots, and a distance between the circular through holes is substantially equal to a distance between a rear end of a front one of the corresponding pair of slots and a rear end of a rear one of the corresponding pair of slots.

5. The cabinet of claim 1, wherein each of the third and fourth supporting posts comprises a first side wall and a second side wall perpendicular to the first side wall, the slots of each of the third and fourth supporting posts being defined in the first side walls with a substantially equal distance between each two neighboring pairs of slots.

6. The cabinet of claim 3, wherein a plurality of through holes are defined in the second side walls, each of the through holes corresponds to a respective pair of slots, and each of the engaging units further comprises an adjusting fastener extended through a corresponding through hole to abut against the sliding element to adjust the engagement between the pressing element and the corresponding cutout of the electronic device.

7. The cabinet of claim 6, wherein the adjusting fastener is horizontally moveable in the corresponding through hole to thereby drive the sliding element and the pressing element to move forward together with the pins sliding along the corresponding pair of slots.

8. The cabinet of claim 6, wherein the sliding element and the pressing element are located at two opposite sides of the first side wall, respectively.

9. An electronic assembly, comprising:
a plurality of electronic devices, each having a cutout; and
a cabinet accommodating the electronic devices therein, the cabinet comprising:
a rack having a rectangular parallelepiped construction, the rack comprising a first supporting post, a second supporting post, a third supporting post and a fourth supporting post located at four corners of the rectangular parallelepiped, an opening defined between the first supporting post and the second supporting post, at least one of the third and fourth supporting posts defining a plurality of pairs of slots therein; and
a plurality of engaging units corresponding to the electronic devices being mounted on the at least one of the third and the fourth supporting posts, each of the engaging units comprising a sliding element defining a pair of perforations corresponding to a corresponding pair of slots, a pair of pins received through the pair of perforations in the corresponding pair of slots and a pressing element connected with the pins, wherein each of the pair of pins are slidable in the corresponding pair of slots, the pressing element is horizontally moveable toward the opening to thereby adjust physical engagement between portions of the pressing element extended into the cutout of the electronic devices received in the rack thereby securing the electronic devices to the rack.

10. The electronic assembly of claim 9, wherein the engagement between the pressing element and the corresponding cutout is adjusted by changing a length of a portion of the pressing element which is extended into the corresponding cutout.

11. The electronic assembly of claim 9, wherein the pressing element comprises a first end surface nearer to the opening and a second end surface far away from the first end surface, the second end surface being longer than the first end surface.

12. The electronic assembly of claim 11, wherein the pressing element further comprises two inclined side surfaces connected between two opposite ends of the first and second end surfaces, respectively, and the inclined side surfaces form a convergent end of the pressing element at the first end surface and a divergent end of the pressing element at the second end surface.

13. The electronic assembly of claim 11, wherein the slots in each pair of slots are aligned with each other, the pressing element defines two circular through holes corresponding to the respective pair of slots, and a distance between the circular through holes is substantially equal to a distance between a rear end of a front one of the corresponding pair of slots and a rear end of a rear one of the corresponding pair of slots.

14. The electronic assembly of claim 9, wherein the at least one third and fourth supporting posts comprises a first side wall and a second side wall perpendicular to the first side wall, the slots of at least one third and fourth supporting posts being defined in the first side wall with a substantially equal distance between each two neighboring pairs of slots.

15. The electronic assembly of claim 12, wherein a plurality of through holes are defined in the second side wall, each of the through holes corresponds to a respective pair of slots, and each of the engaging units further comprises a sliding element connected with the pins and an adjusting fastener extended through a corresponding perforation to abut against the sliding element to adjust the engagement between the pressing element and the corresponding cutout of the electronic device.

16. The electronic assembly of claim 15, wherein the adjusting fastener is horizontally moveable in the corresponding through hole, to thereby drive the sliding element and the pressing element to move forward together with the pins sliding along the corresponding pair of slots.

17. The electronic assembly of claim 15, wherein the sliding element and the pressing element are located at two opposite sides of the first side wall, respectively.

18. The electronic assembly of claim 9, wherein the electronic devices are servers.

19. The electronic assembly of claim 9, wherein two opposite sides of a front side of each of the electronic devices connect the first and second supporting posts, respectively, and two opposite side of a rear side of each of the electronic devices connect two corresponding engaging units which are mounted at the third and fourth supporting posts, respectively.

* * * * *